United States Patent [19]

Takashima et al.

[11] Patent Number: 5,285,284
[45] Date of Patent: Feb. 8, 1994

[54] TELEVISION RECEIVER WITH A DUAL TUNER SYSTEM

[75] Inventors: Tadoa Takashima; Takayuki Sudoh, both of Saitama, Japan

[73] Assignee: Kabushiki Kaisha Toshiba, Kawasaki, Japan

[21] Appl. No.: 972,027

[22] Filed: Nov. 9, 1992

[30] Foreign Application Priority Data

Nov. 15, 1991 [JP] Japan ............... 3-300413

[51] Int. Cl.$^5$ ........................... H04N 5/445
[52] U.S. Cl. ........................ 348/731; 348/565; 348/734
[58] Field of Search ............ 358/194.1, 191.1, 183, 358/188, 181, 22 PIP; 455/296, 132, 139, 295; H04N 5/445

[56] References Cited

U.S. PATENT DOCUMENTS

| | | | |
|---|---|---|---|
| 3,639,840 | 2/1972 | Shekel et al. | 455/132 |
| 4,238,773 | 12/1980 | Tsuboka et al. | 358/183 |
| 4,270,212 | 5/1981 | Furukawa | 455/6.2 |
| 4,682,234 | 7/1987 | Naimpally | 358/181 |
| 4,729,028 | 3/1988 | Micic et al. | 358/183 |
| 5,045,948 | 9/1991 | Streck et al. | 455/132 |

FOREIGN PATENT DOCUMENTS 0141462 6/1988 Japan.

Primary Examiner—James J. Groody
Assistant Examiner—Jeffrey S. Murrell
Attorney, Agent, or Firm—Cushman, Darby & Cushman

[57] ABSTRACT

A television receiver having first and second tuners which can receive the same frequency band and display multiple-surfaces includes key inputting means for indicating that the display of a second tuner picture in a plurality of tuners is on or off and channel selection controlling means for making the second tuner an ordinary selected condition when the key inputting means indicates that the display of the second tuner picture is on and fixing the second tuner's local oscillation frequency so as to set a frequency received by the second tuner outside a receivable frequency band when the key inputting means indicates that the display of the second tuner picture is off. Thereby, mutual beat interference between the plurality of tuners is eliminated.

6 Claims, 4 Drawing Sheets

TELEVISION RECEIVER WITH A DUAL TUNER SYSTEM

BACKGROUND OF THE INVENTION

1. Field of the Invention

The present invention relates to a television receiver having a plurality of tuners like a picture in picture (PIP, hereinafter) system.

2. Description of the Related Art

A television receiver of a PIP system has two tuners for a main picture and a sub picture and can display images of different channels simultaneously in the main picture and the sub picture.

In the conventional television receiver with a PIP function, a sub picture signal is not shown on a cathode-ray tube (CRT) when the sub picture display is off; however, a sub picture tuner is generally kept operated.

In the aforesaid television receiver, when the main picture display is executed with the sub picture display, beat interference is generated in the main picture depending on each selected channel in both pictures.

For example, let us consider a case when an UHF channel 15 is selected as a main picture and a VHF channel 6 is selected as a sub picture. Here, an example of frequencies of the television broadcast channels in Japan (12 channels in VHF band and 50 channels in UHF band, thus, 62 channels all together) will be explained. A frequency band of the channel 15 is 482–488 MHz. A frequency band of the channel 6 is 182–188 MHz and its local oscillation frequency is 242 MHz. Therefore, a harmonic wave twice the value ($242 \times 2 = 484$ MHz) of the local oscillation frequency of channel 6 will interfere with a video signal 483.25 MHz of channel 15, so that a difference signal beat of 0.75 MHz is generated. Thus, beat interference occurs on the main picture.

In another example, when an UHF channel 52 (a frequency band 704–710 MHz) is selected as a main picture and a VHF channel 5 (a frequency band 176–182 MHz) is selected as a sub picture, a harmonic wave three times the value (708 MHz) of the local oscillation frequency 236 MHz of the sub picture channel 5 is generated from the tuner for the sub picture and interferes with a video signal 705.25 MHz of the UHF channel 52 of the main picture, so that stripes of a different signal beat 2.75 MHz are generated as picture interference.

Also, beat interference based on the frequency deviation (mutual frequency deviation from a specified frequency 58.75 MHz) between two video intermediate frequency outputs received by two tuners for the main picture and the sub picture, respectively, or voice beat interference based on the frequency deviation (mutual frequency deviation from a specified frequency 54.25 MHz) between two sound intermediate frequency outputs is generated.

Thus, a beat which a harmonic wave n times as large as the local oscillation frequency, a beat due to mutual interference between main and sub in an intermediate frequency output received by two tuners, or a voice beat is generated.

The aforesaid beat interference is generated as long as the tuner for the sub picture the operating, condition even if the sub picture display is off, thereby damaging the quality of the main picture.

In order to resolve the beat interference, a filter is added between a common power source of the tuners and a common control line of the tuners, and a booster or the like is added to a television signal branching device to improve isolation, so that the interference can be improved to some extent. However, it is difficult to reduce the interference completely by direct induction based on the disposition of both tuners.

Then, when a tuner is not needed for use (for example, when the sub picture is off in PIP) in the television receiver having a plurality of tuners, a method is provided for turning off the power source of the tuner as a method of improving the aforesaid mutual interference.

FIG. 4 shows an example of a television receiver having a PIP function of prior art. A television signal of a high frequency wave (including a VHF signal and an UHF signal) is supplied to an input terminal 1. The television signal is branched by a branching device 2 and fed to a main picture tuner 3 and a sub picture tuner 4, respectively. To each channel selection controlling terminal of the tuners 3 and 4, channel selection controlling signals S1 and S2 in accordance with the receiving channels of the tuners 3 and 4 are supplied to channel selecting terminals of the tuners 3 and 4 from a microcomputer 5 for channel selecting control, respectively. The receiving channels of the tuners 3 and 4 are specified by key inputting means 6. A video intermediate frequency signal from the tuner 3 is detected by a video detector 7 and supplied to the next circuit as a video output for the main picture. A video intermediate frequency signal from the tuner 4 is detected by the video detector 9 and supplied to the next circuit as a video output for the sub picture. Source voltage VDD is supplied to the tuner 3 from dc power source, while the source voltage VDD is supplied to the tuner 4 through a switch 11. The microcomputer 5 feeds the channel selection controlling signals S1 and S2 in accordance with the key inputting means 6 to the tuners 3 and 4 and indicates the channels to be received by the tuners 3 and 4, respectively. Also, the microcomputer 5 outputs a control signal S3 for making the switch 11 on or off (that is, making the sub picture tuner 4 on or off) by making the sub picture display on or off using the key inputting means 6.

Thereby, the power source of the sub picture tuner 4 is turned off by the switch 11 when the sub picture is off, so that the interference affecting the main picture can be deleted.

FIG. 5 shows another prior art of a television receiver having the PIP function. In FIG. 5, main and sub pictures are formed so as to be received by one circuit of the two tuners 3 and 4, thereby, for example, a main picture and a sub picture can be exchanged. A different point of the circuit in FIG. 5 from that in FIG. 4 is to supply dc source voltage VDD to the tuner 4 through a switch 11, while the VDD is supplied to the tuner 3 through a switch 12, and the switches 11 and 12 are turned on/off by control signals S3 and S4 from a microcomputer 5A based on the key inputting means 6, respectively. Also, a video output from a video detector 7 is fed to each of the input terminals a of switches 13 and 14, and a video output from a video detector 9 is supplied to each of the other input terminals b of the switches 13 and 14. The input terminals a and b of each switch can be controlled by signals S5 and S6. The video output for the main picture is taken out from the output terminal c of the switch 13 and the video output for the sub picture is taken out from the output terminal c of the switch 14. The input terminals a and b of the switches 13 and 14 can be selectively changed over by the control signals S5 and S6, respectively, from the microcomputer 5A based on the key inputting means 6.

Accordingly, when the sub picture is off, the power source of a sub picture tuner of the tuners 3 and 4 is off by the switches 11 or 12, so that the interference affecting the main picture can be deleted.

In the television receiver having such a plurality of tuners which can receive the same frequency band, an abnormal picture is still developed in the circuit in which a power supply is turned off in order to erase mutual interference between tuners as a fluctuation in the power source load is created when on or off is made or due to the transient response when it is on or off. If the prevention of the abnormal picture is considered, difficulties arise in designing the television receiver to not include disadvantageous costs.

As the aforesaid, in the conventional television receiver, there has been problems in which beat interference is generated in the main picture when the sub picture tuner is kept working at the time of the sub picture is off and in which it is difficult to design the television receiver and the costs of surrounding circuits rise if the fluctuation of the power source load when it is on or off and the transient response are considered in the circuit which makes the tuner power source for the sub picture off when the sub picture is off.

SUMMARY OF THE INVENTION

An object of the present invention is to provide a television receiver having no mutual interference among a plurality of tuners and no picture interference.

Another object of the present invention is to provide a television receiver having the advantage of less difficulty in designing a circuit and of less costs without using means for making a tuner power source on/off.

In other words, the television receiver of the invention comprises first and second tuners being able to receive signals in a predetermined frequency band, respectively, displaying means being able to simultaneously display the signals received by these first and second tuners, key inputting means being able to generate a first indicating signal for simultaneously displaying the signals received by the first and second tuners, and a second indicating signal for displaying only the signals received by the first tuner, and control means for controlling the first and second tuners in response to the first and second indicating signals, the control means for setting frequencies received by the first and second tuners within the frequency band when the first indicating signal is generated and setting a frequency received by the first tuner within the frequency band and setting a frequency received by the second tuner outside the frequency band when the second indicating signal is generated.

In this invention, in the case in which the second tuner is a tuner for the sub picture, the second tuner is automatically fixed at a receiving frequency, which does not generate mutual beat interference, by control means when the sub picture display is off. When the sub picture display is off, this invention has the structure in which the power source of the sub picture tuner is always added; however, the tuner power source of the sub picture tuner is made off in the conventional tuner structure. Thereby, in this invention, the responsibility of video display becomes faster than the conventional invention when the sub picture display which is off is canceled and the sub picture is displayed again.

DETAILED DESCRIPTION OF THE PREFERRED EMBODIMENT

Figure 1:
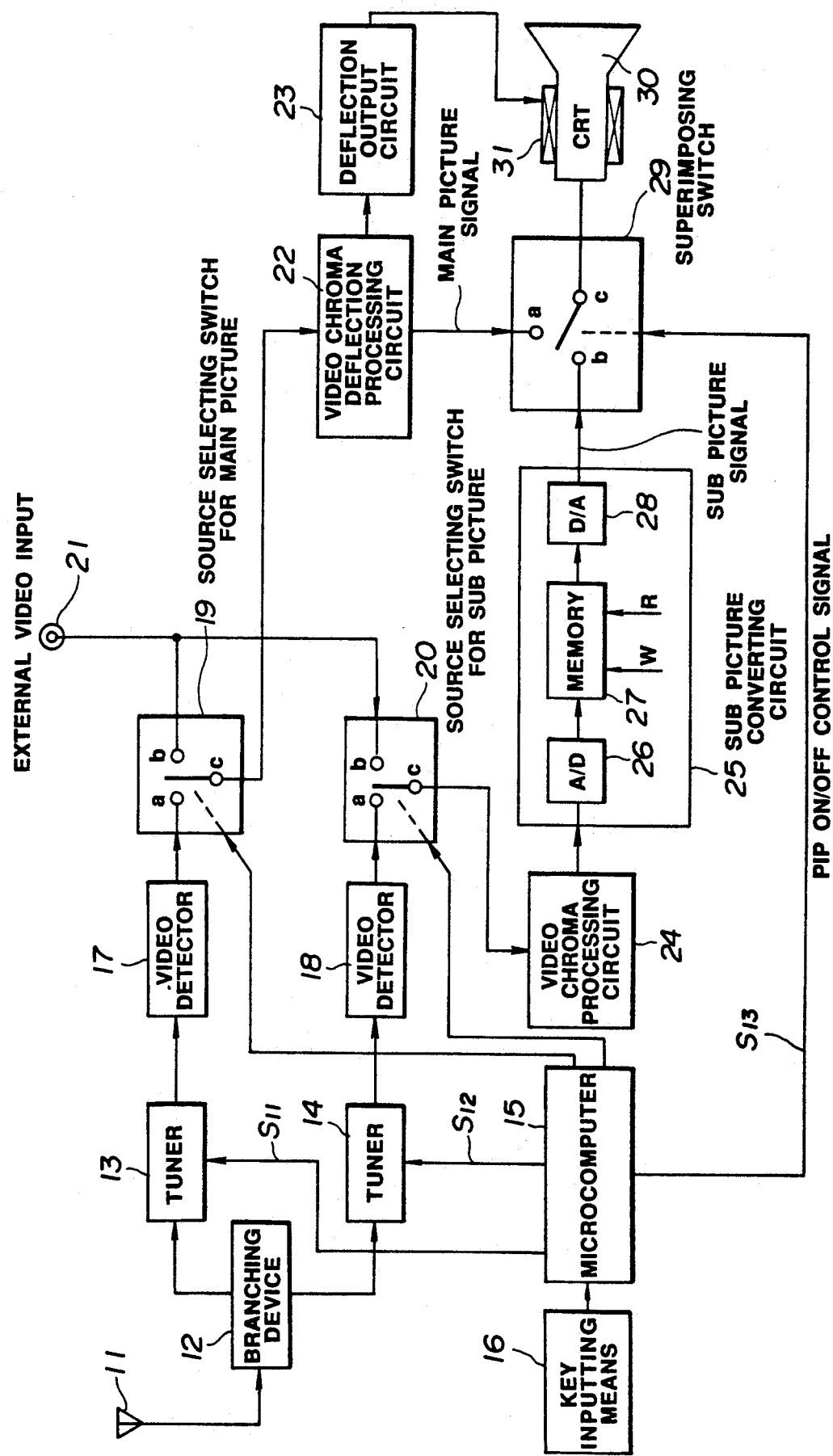
FIG. 1 is a block diagram showing a television receiver of an embodiment of the present invention.

FIG. 1 is a block diagram showing a television receiver of an embodiment of the present invention.

In FIG. 1, a television signal (including a VHF signal and an UHF signal) of a high frequency wave is supplied to an antenna 11. The television signal is branched by a branching device 12 and supplied to a main picture tuner 13 and a sub picture tuner 14, respectively. Channel selecting control signals S11 and S12, in accordance with the receiving channels of the tuners 13 and 14, are supplied to the channel selection controlling terminals of the tuners 13 and 14 from a microcomputer 15 for channel selection controlling. A video intermediate frequency signal from the tuner 13 is detected by a video detector 17 and output as a video detecting signal for the main picture. Also, a video intermediate frequency signal from the tuner 14 is detected by a video detector 18 and output as a video detecting signal for the sub picture. Video detecting outputs for the main picture, and the sub picture, which are output from the video detectors 17 and 18, are supplied to the inputting terminals a of the video source, selecting switches for the main picture and the sub picture 19 and 20. A video signal from an external video inputting terminal 21 is supplied to the input terminals b of the video source selecting switches for the main picture and the sub picture 19 and 20. The external video input is a video signal from an external video source including VTR. The input terminals a and b of the switch 19 can be changed over by a control signal from the microcomputer 15 based on a key input. A video signal for the main picture from the input terminals a and b is selectively output from an output terminal c. Similarly, the input terminals a and b of the switch 20 can be changed over by the control signal from the microcomputer 15. A video signal for the sub picture from the input terminals a and b is selectively output from the output terminal c. The video signal from the video source selecting switch for a main picture 19 is supplied to a video-chroma-deflection processing circuit 22, so that the main picture signal, which is video-chroma-processed, is supplied to an input terminal a of a superimposing switch 29. A signal for horizontal and vertical drives which are deflection-processed by the video-chroma-deflection processing circuit 22 is supplied to a deflection output circuit 23. The horizontal and vertical deflection outputs which are obtained in the circuit 23 are supplied to a deflecting yoke 31 on a cathode-ray tube (CRT) 30. The video signal from the video source selecting switch for the sub picture 20 is supplied to a video-chroma-processing circuit 24. The sub picture signal is video-chroma-processed and supplied to a sub picture converting circuit 25.

The sub picture converting circuit 25 consists of an analog/digital converter (A/D, hereinafter) 26, a field memory 27 and a digital/analog converter (D/A, hereinafter) 28. In the sub picture converting circuit 25, the sub picture signal from the aforesaid video-chroma-processing circuit 24 is converted into a digital signal by the A/D 26, and then, is written in the field memory 27 by using a write clock W. The sub picture signal written in the field memory 27 is synchronized with a synchronizing signal of the main picture and read at the speed of n times as fast as the speed at the time of writing by using a read clock R. Then, the time base of the signal is compressed in the horizontal direction and output as a form in which scanning lines are thinned out in the vertical direction (that is, the picture is compressed). Next, the output signal is converted into an analog signal by the D/A 28 of the next stage and output. The sub picture signal output from the sub picture converting circuit 25 is supplied to the other input terminal b of the superimposing switch 29.

The input terminals a and b of the superimposing switch 29 can be selectively changed over by a PIP on/off control signal S13 from the microcomputer 15. At the normal time when a PIP display is not carried out (at the time of PIP off), the switch 29 is changed over only to the side of the input terminal a, so that the main picture signal is supplied from the output terminal c to a cathode of the CRT 30. At the time when the PIP display is carried out (at the time of PIP on), a sub picture displaying period is changed over to the side b and a main displaying period to the side a. The sub picture signal is superimposed on the main picture signal to be output and supplied to the cathode of the CRT 30.

While the microcomputer 15 supplies the channel selecting control signals S11 and S12 from the key inputting means 16 to the tuners 13 and 14, respectively, and specifies each channel to be received, it outputs a control signal S13 for controlling the PIP to be on or off and makes the switch 29 selectively change over between the input terminals a and b when the key inputting means 16 specifies that the sub picture display is on or off.

In the television receiver with such a PIP function, a television signal is supplied to the main picture tuner 13 and the sub picture tuner 14 through the branching device 12. Each local oscillation frequency of the main picture tuner 13 and the sub picture tuner 14 can select a channel separately by the channel selection controlling signals S11 and S12 output from the microcomputer 15 based on the key inputting means 16, respectively. When the main picture shows a picture, circuit isolation is improved by a filter, a booster or the like as usual and the mutual interference is reduced. In addition, when the sub picture display is off, the switch 29 is connected to the side a, so that the output of the sub picture tuner 14 is not transmitted to the CRT 30. Therefore, when the sub picture display is off, the sub picture is not displayed on the CRT 30 and the tuner 14 is in the operating condition. At this time, the local oscillation frequency of the sub picture tuner 14 is fixed at a higher frequency in which mutual beat interference is not generated by the channel selection controlling signal S12 from the microcomputer 15.

Typical elements of the mutual interference are indicated below:

(1) a higher harmonic wave, as high as n times of the local oscillation frequency of the sub picture tuner's receiving channel, is mixed in the receiving channel's frequency of the main picture tuner;
(2) The fundamental waves of the local oscillation frequencies of the receiving channels when the same channel is received by the main picture and sub picture tuners are mutually mixed (there is deviation in the local oscillation frequencies of both tuners and the frequencies mutually interfere); and
(3) In the main picture and sub picture tuners, both intermediate frequency wave signals mutually mix (there is deviation in the intermediate frequencies of both tuners and the frequencies mutually interfere).

If an UHF channel 62 (frequency band 764-770 MHz) is the upper limit channel for enabling to receive, the local oscillation frequency of the sub picture tuner in which the aforesaid beat interference does not occur is the frequency exceeding the local oscillation frequency 824 MHz of the channel 62 (for example, 830 MHz higher than 824 MHz by a frequency 6 MHz of one channel interval). In this way, if the frequency of a channel which is higher than the upper limit channel for enabling to receive is selected, as the local oscillation frequency of the sub picture tuner, the beat interference affecting the main picture can be eliminated. Also, because the tuner power source is kept on, the tuning response at the time of turning off the sub picture is not delayed. That is, when the sub picture display is off, the tuning position of the tuner 14 is fixed at 830 MHz by the microcomputer control, so that the same mutual interference preventing effect as obtained from turning off the tuner power source exists. Since the responsibility of the local oscillation frequency at the time of canceling its fixation is fast, its video mute time becomes shorter than that of the conventional power source on/off system.

Figure 2:
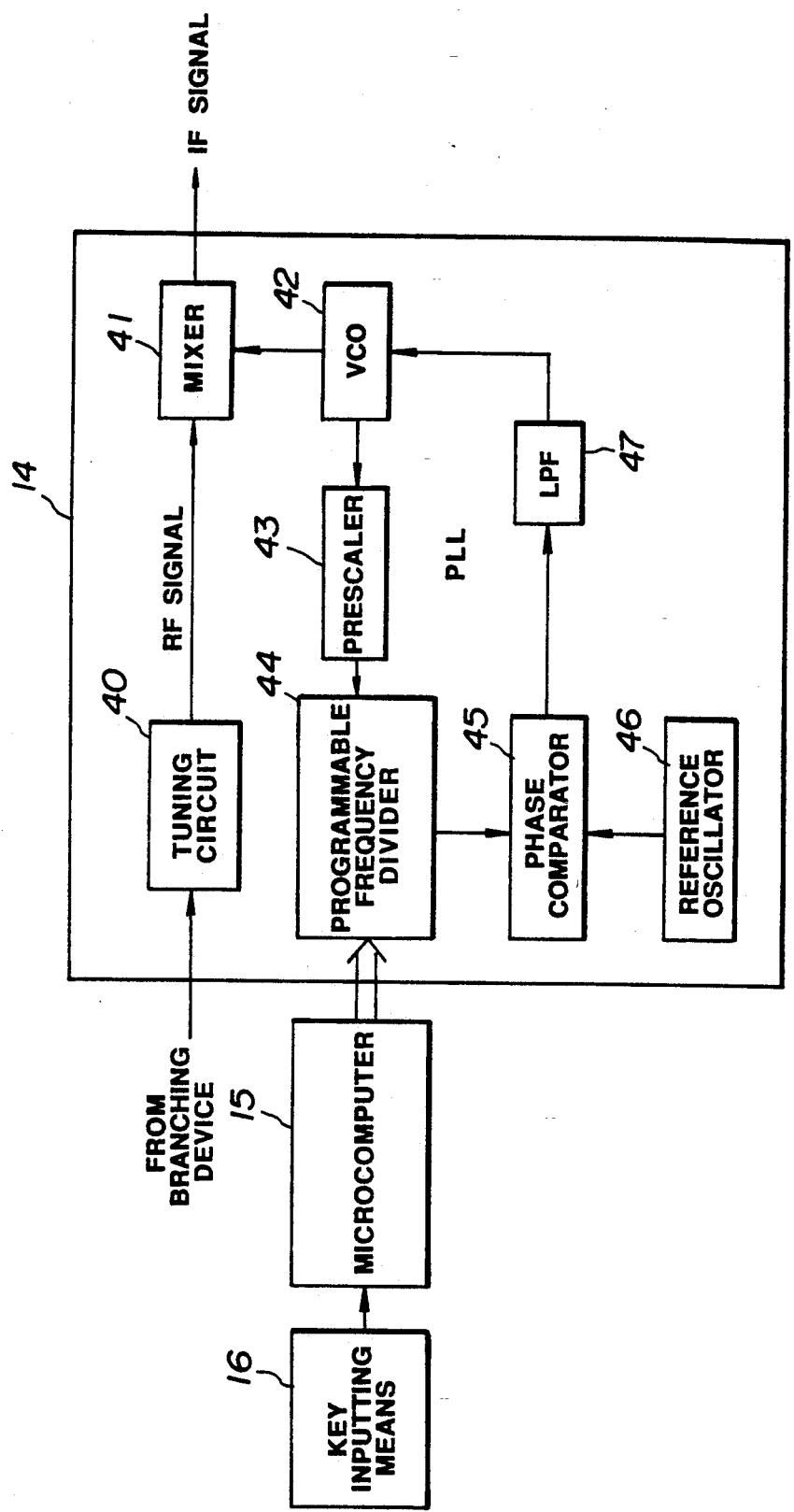
FIG. 2 is a block diagram showing an example of structure of a tuner part in FIG. 1.

FIG. 2 is a block diagram showing the structure of the tuner part in FIG. 1. Here, a channel selecting circuit by a PLL frequency synthesizer system will be explained. In the tuner, a high frequency wave signal (RF signal) from the branching device 12 is fed to one of the input terminals of a mixer 41 through a tuning circuit 40. A local oscillation signal from a voltage controlled oscillator (VCO, hereinafter) 42 is fed to other input terminal of the mixer 41. Thus, an intermediate frequency signal (IF signal) can be obtained as an output of the mixer 41. The VCO 42 forms a PLL (phase locked loop) with a prescaler (fixed frequency divider) 43, a programmable frequency divider 44, a phase comparator 45, a reference oscillator 46 and a low pass filter (LPF) 47. The local oscillation signal from the VCO 42 is supplied to the mixer 41 and the prescaler 43. The local oscillation frequency is divided into a predetermined number in the prescaler 43 and further divided into 1/N by the programmable frequency divider 44, and then, supplied to one of the input terminals of the phase comparator 45. A frequency dividing ratio (N) of the programmable frequency divider 44 can be changed by a channel selection controlling signal from the microcomputer 15. Accordingly, the microcomputer 15 provides a frequency dividing ratio data corresponding to the channel specified by the key inputting means 16 to the frequency divider 44. In the phase comparator 45, the phase of the frequency from the frequency divider 44 is compared with that of the reference oscillation frequency from the reference oscillator 46, and its comparative output is made to be direct-current by the LPF 47 and supplied to the oscillation control terminal of the VCO 42. Thereby, the local oscillation frequency of the tuner can be correctly adjusted to the frequency of the channel designated by the key inputting means 16.

When a key input that turns off the sub picture display is provided from the key inputting means 16 when the tuner, formed as discussed above is used as the sub picture tuner 14, the microcomputer 15 sets a frequency dividing ratio (N) so as to select more than a channel 62, but a upper limit (for example, a channel 63) by controlling the programmable frequency divider 44. Thus, the main picture beat interference can be prevented.

Figure 3:
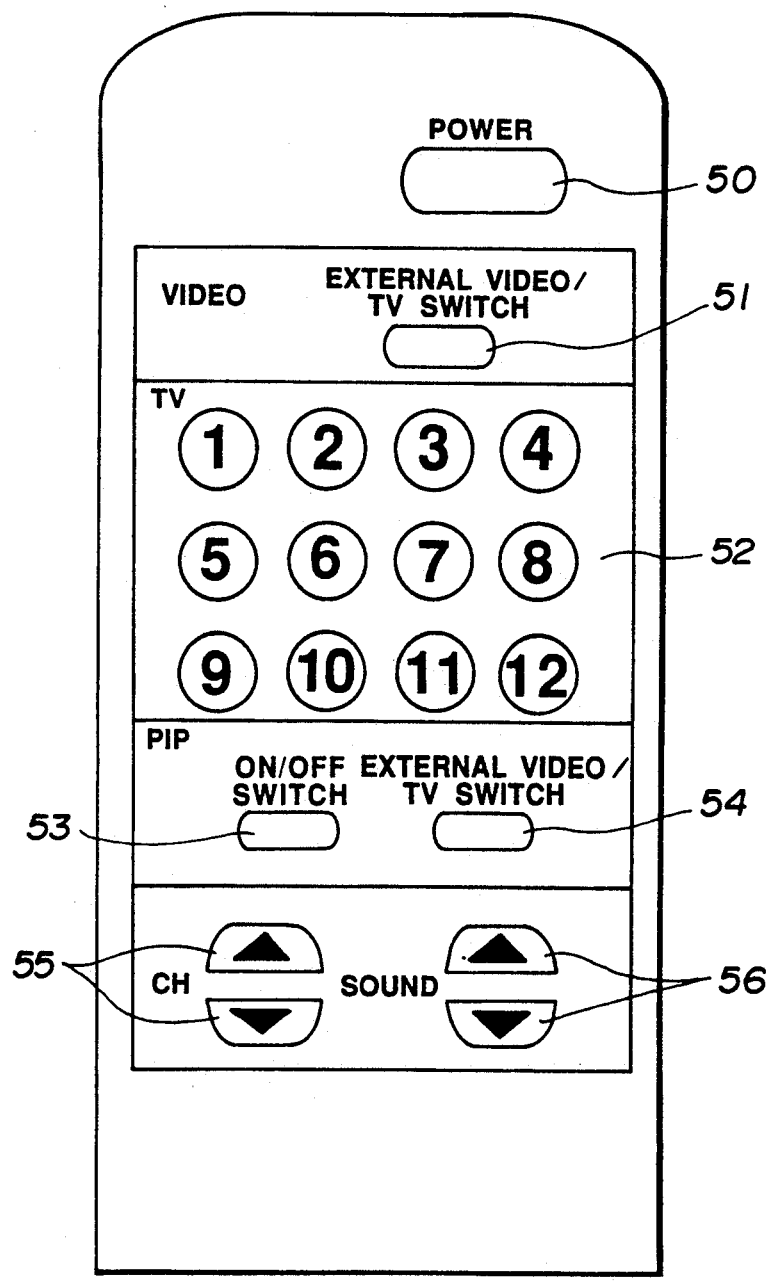
FIG. 3 is a plan view of an example of key inputting means in FIG. 1.
Figure 4:
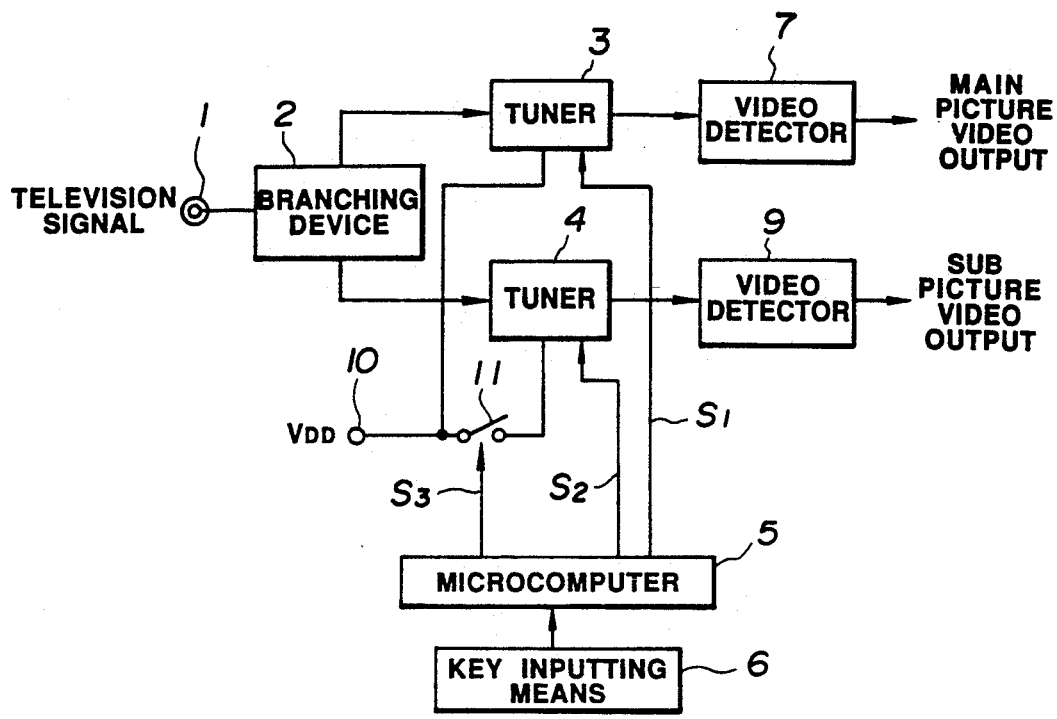
FIG. 4 is a block diagram showing an essential part of television receiver of related art.
Figure 5:
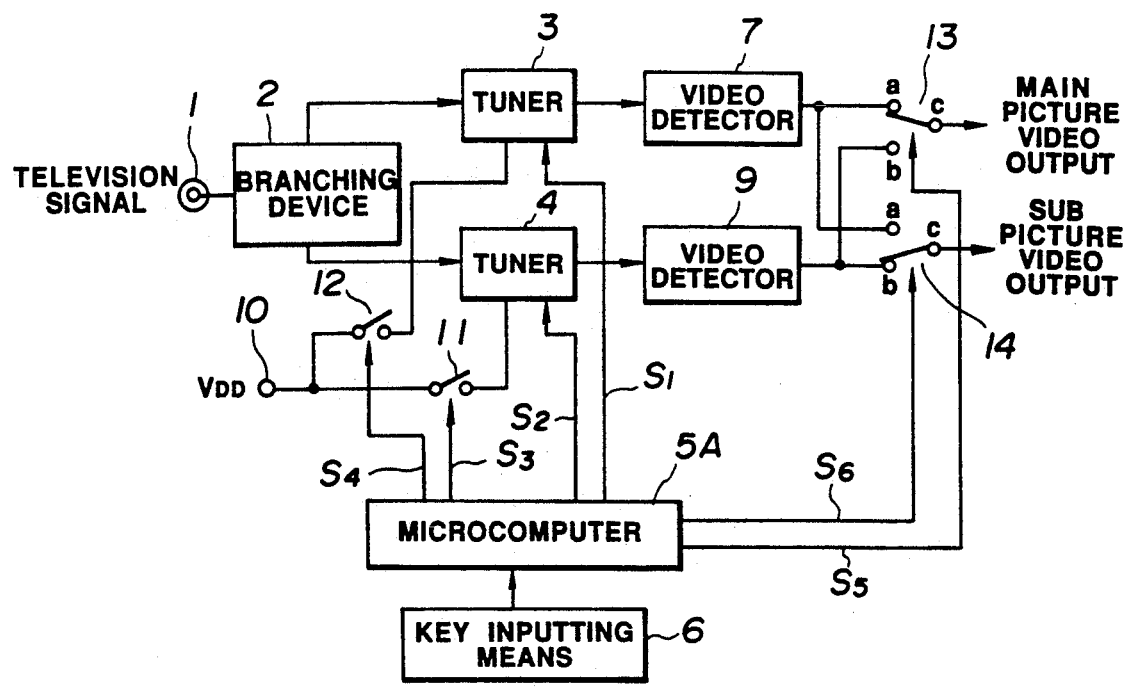
FIG. 5 is a block diagram showing an essential part of another conventional television receiver of related art.

FIG. 3 is a plan view showing an example of key inputting means in FIG. 1. Here, a case using a remote control transmitter as the key inputting means 16 will be explained. A reference numeral 50 is a power button for switching TV power source. 51 is an external video/TV button for switching the main picture from a TV input to an external video input. By pushing this button, the source selecting switch for the main picture 19 in FIG. 1 can be switched. 52 is a television broadcast channel button of a direct system. 53 and 54 are buttons for operating the sub picture. 53 is a sub picture on/off button. By pushing this button, the sub picture display can be turned on/off for the main picture display shown on the CRT 30 in FIG. 1. 54 is an external video/TV button for switching the sub picture from a TV input to an external video input. By pushing this button, the source selecting switch for the sub picture 20 in FIG. 1 can be switched. 55 is a channel button of an up-down system. 56 is a volume button.

When a key input that turns off the sub picture display off is provided from the key inputting means 16 by pushing the aforesaid sub picture on/off button 53, the microcomputer 15 supplies the control signal S13 making the PIP off to the superimposing switch 29 and fixes the switch 29 on the side a of the input terminal. Then, only the main picture signal is supplied to the CRT 30 from the output terminal c. At the same time, the microcomputer 15 controls the sub picture tuner 14 and fixes the local oscillation frequency of the sub picture at a predetermined value so that the frequency of the sub picture tuner enters a range outside the receivable frequency band.

As the aforesaid, according to the present invention, the local oscillation frequency of the sub picture tuner is fixed at a frequency (for example, higher frequency than the local oscillation frequency of the UHF channel 62) in which mutual beat interference does not occur when the sub picture is off, so that the beat interference by the mutual interference between the sub picture tuner and the main picture tuner can be eliminated. In this way, because the sub picture tuner is adjusted to a receiving frequency equal to or higher than the upper limit channel when the sub picture is off, the responsibility when the sub picture is off is canceled while its display can be resumed faster than the conventional power source on/off system. In addition, this invention is advantageous in that its production cost is low.

In the aforesaid embodiment, the local oscillation frequency of the sub picture tuner is fixed at a higher frequency than the upper limit channel frequency so as to set its receiving frequency outside the receivable frequency band when the sub picture is off. However, in this invention, the local oscillation frequency of the sub picture tuner may be fixed at a frequency lower than the lower limit channel frequency (that is, the frequency of the channel 1 in the VHF band). Nevertheless, because the frequency band lower than the lower limit channel frequency has little room within the fixed frequency range of the tuner, it is better that the local oscillation frequency of the sub picture tuner is fixed at the band of the frequency higher than the upper limit channel frequency when the sub picture is off as in the aforesaid embodiment.

In the aforesaid embodiment, the television receiver with a PIP function having two tuners for the main picture and the sub picture is explained. However, this invention is not restricted to the television receiver, and is applied to a television receiver disposing a plurality of tuners which are two or more can receive the same frequency band and being used by switching these tuners.

For example, like a Hi-Vision (high-definition television) receiver, this invention can be applied to a television receiver with a POP (picture out picture) function which can display a sub picture by disposing it outside the main picture.

Also, this invention is not restricted only by the aforesaid embodiment and various transformations can be implemented without departing from the scope of the invention.

What is claimed is:

1. A television receiver comprising:
   first and second tuners able to receive signals in a predetermined frequency band, respectively;
   displaying means able to simultaneously display the signals received by said first and second tuners;
   key inputting means able to generate a first indicating signal for simultaneously displaying the signals received by said first and second tuners and a second indicating signal for displaying only the signal received by said first tuner; and
   control means for controlling said first and second tuners in response to said first and second indicating signals, the control means setting frequencies received by said first and second tuners within said frequency band when said first indicating signal is generated, and said control means setting a frequency received by said first tuner within said frequency band and setting a frequency received by said second tuner outside said frequency band when said second indicating signal is generated.

2. A television receiver comprising:
   first and second tuners being able to receive signals in a predetermined frequency band, respectively;
   displaying means able to simultaneously display the signals received by said first and second tuners;
   key inputting means able to generate a first indicating signal for simultaneously displaying the signals received by said first and second tuners and a second indicating signal for displaying only the signal received by said first tuner; and
   control means for controlling local oscillation frequencies of said first and second tuners in response to said first and second indicating signals and setting frequencies received by said first and second tuners, said control means for setting frequencies received by said first and second tuners within said frequency band when said first indicating signal is generated, and setting a frequency received by said first tuner within said frequency band and setting a frequency received by said second tuner outside said frequency band when said second indicating signal is generated.

3. The television receiver according to claim 2 wherein said control means controls a local oscillation frequency of said second tuner so as to set the frequency received by said second tuner at a high frequency outside said frequency band when said second indicating signal is generated from said key inputting means.

4. The television receiver according to claim 2 wherein each of said first and second tuners includes a phase locked loop having a voltage controlled oscillator, a fixed frequency divider, a variable frequency divider, a reference oscillator, a phase comparator and a low pass filter, said first and second tuners able to select channels by changing a frequency dividing ratio of said variable frequency divider by said control means, respectively, said control means fixing the second tuner's local oscillation frequency so as to set the frequency received by said second tuner outside said frequency band by controlling a frequency dividing ratio of said variable frequency divider when said key inputting means generates said second indicating signal.

5. A television receiver comprising:
first and second tuners able to receive signals in a predetermined frequency band, respectively;
key inputting means for indicating each channel received by said first and second tuners and able to indicate whether a signal received from said second tuner is displayed or not;
first and second detecting means for detecting video signals output from said first and second tuners;
first processing means for processing a detecting output from said first detecting means to produce a first signal;
signal producing means for producing a second signal compressed by processing a detecting output from said second detecting means;
switching means for selectively outputting either said first signal only or a signal in which said second signal is superimposed onto said first signal, by selectively switching said first signal from said first processing means and said second signal from said signal producing means;
video displaying means for displaying an output signal from said switching means; and
channel selection controlling means for controlling a channel selection by controlling local oscillation frequencies for said first and second tuners and selectively switching said switching means, said channel selection controlling means setting a frequency received by said second tuner within said frequency band when said key inputting means indicates a signal being displayed from said second tuner and controlling said switching means so as to output said signal superimposing said second signal onto said first signal by selectively switching said switching means, said channel selection controlling means controlling said switching means so as to select only a first signal based on an output from said first tuner and fixing said second tuner's local oscillation frequency at a predetermined frequency so as to set a frequency received by said second tuner outside said frequency band when said key inputting means indicating that display of the signal from said second tuner is not needed.

6. The television receiver according to claim 5 wherein said channel selection controlling means fixes said second tuner's local oscillation frequency so as to set a frequency received by said second tuner at a high frequency outside said frequency band when said key inputting means indicates that display of a signal from said second tuner is not needed.

* * * * *